United States Patent
Vincent et al.

(10) Patent No.: US 8,709,918 B2
(45) Date of Patent: Apr. 29, 2014

(54) METHOD FOR SELECTIVE DEPOSITION OF A SEMICONDUCTOR MATERIAL

(75) Inventors: Benjamin Vincent, Elsene (BE); Roger Loo, Leuven (BE); Matty Caymax, Leuven (BE)

(73) Assignee: IMEC, Leuven (BE)

( * ) Notice: Subject to any disclaimer, the term of this patent is extended or adjusted under 35 U.S.C. 154(b) by 84 days.

(21) Appl. No.: 13/351,344

(22) Filed: Jan. 17, 2012

(65) Prior Publication Data

US 2012/0184088 A1 Jul. 19, 2012

Related U.S. Application Data

(60) Provisional application No. 61/433,455, filed on Jan. 17, 2011, provisional application No. 61/536,772, filed on Sep. 20, 2011.

(51) Int. Cl.
*H01L 21/20* (2006.01)

(52) U.S. Cl.
USPC .................................. 438/478; 257/E21.108

(58) Field of Classification Search
CPC ..................... H01L 21/0237; H01L 21/02532; H01L 21/02535; H01L 21/02573; H01L 21/0262; H01L 21/02636
USPC .................................. 257/E21.108; 438/478
See application file for complete search history.

(56) References Cited

U.S. PATENT DOCUMENTS

| | | | |
|---|---|---|---|
| 3,836,999 A * | 9/1974 | Nishizawa | 148/33 |
| 7,037,770 B2 * | 5/2006 | Chidambarrao et al. | 438/154 |
| 7,495,291 B2 * | 2/2009 | Chidambarrao et al. | 257/371 |
| 7,598,513 B2 * | 10/2009 | Kouvetakis et al. | 257/14 |
| 7,718,469 B2 * | 5/2010 | Hasan | 438/105 |
| 8,501,600 B2 * | 8/2013 | Sanchez et al. | 438/510 |
| 2004/0227158 A1 * | 11/2004 | Delhougne et al. | 257/202 |
| 2005/0277272 A1 | 12/2005 | Singh et al. | |
| 2007/0117358 A1 * | 5/2007 | Tsai et al. | 438/481 |
| 2009/0111246 A1 | 4/2009 | Bauer et al. | |
| 2011/0027944 A1 * | 2/2011 | Liu et al. | 438/124 |
| 2011/0281412 A1 * | 11/2011 | Ernst et al. | 438/287 |
| 2012/0077335 A1 * | 3/2012 | Sanchez et al. | 438/478 |
| 2013/0256838 A1 * | 10/2013 | Sanchez et al. | 257/616 |

FOREIGN PATENT DOCUMENTS

WO 2005087983 A2 9/2005

OTHER PUBLICATIONS

Extended European Search Report in European Patent Application No. 12151255.2, dated Dec. 20, 2013, mailed Jan. 8, 2014.

* cited by examiner

*Primary Examiner* — Kimberly Rizkallah
*Assistant Examiner* — Caleb Henry
(74) *Attorney, Agent, or Firm* — McDonnell Boehnen Hulbert & Berghoff LLP

(57) ABSTRACT

A method for selective deposition of semiconductor materials in semiconductor processing is disclosed. In some embodiments, the method includes providing a patterned substrate comprising a first region and a second region, where the first region comprises an exposed first semiconductor material and the second region comprise an exposed insulator material. The method further includes selectively providing a film of the second semiconductor material on the first semiconductor material of the first region by providing a precursor of a second semiconductor material, a carrier gas that is not reactive with chlorine compounds, and tin-tetrachloride ($SnCl_4$). The tin-tetrachloride inhibits the deposition of the second semiconductor material on the insulator material of the second region.

20 Claims, 2 Drawing Sheets

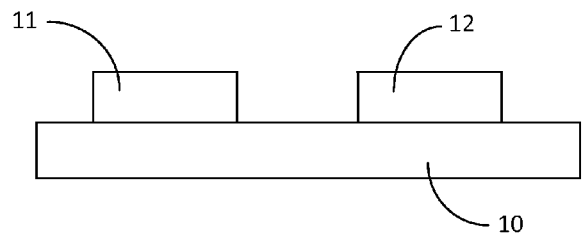
FIG. 1
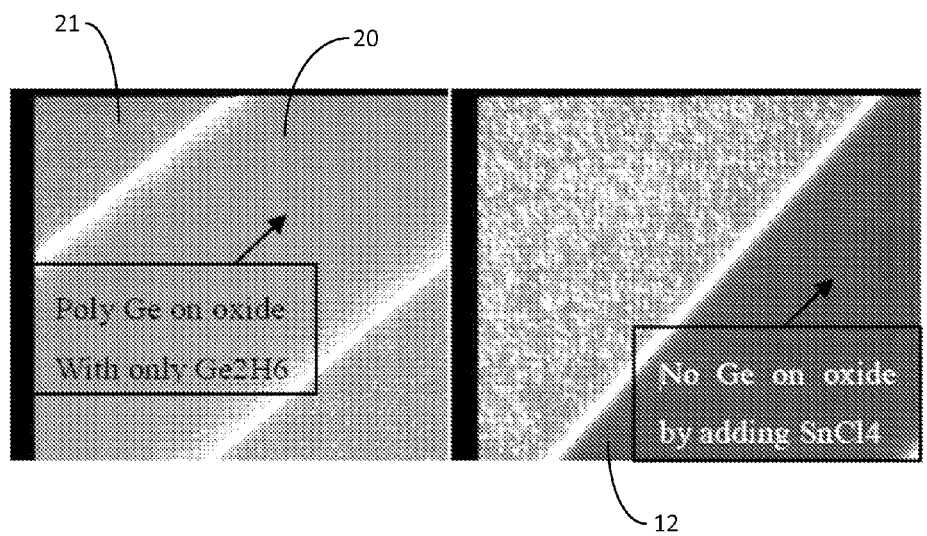
FIG. 2A - PRIOR ART     FIG. 2B

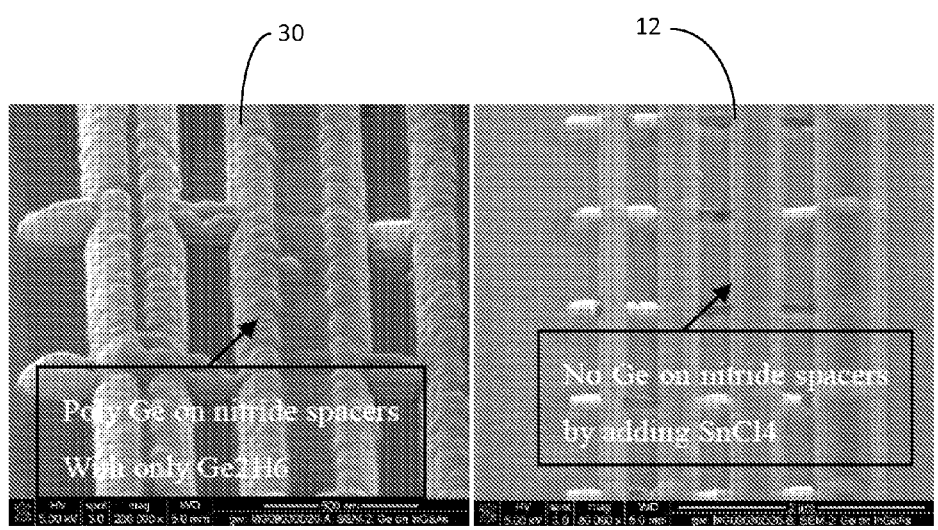
FIG. 3A - PRIOR ART            FIG. 3B

US 8,709,918 B2

METHOD FOR SELECTIVE DEPOSITION OF A SEMICONDUCTOR MATERIAL

CROSS-REFERENCE TO RELATED APPLICATIONS

This application claims priority to U.S. Provisional Patent Application Ser. No. 61/433,455 filed Jan. 17, 2011, the contents of which are hereby incorporated by reference. This application also claims priority to U.S. Provisional Patent Application Ser. No. 61/536,772 filed Sep. 20, 2011, the contents of which are hereby incorporated by reference.

FIELD OF THE DISCLOSURE

The present disclosure relates to the deposition of semiconductor materials in semiconductor processing. More particularly the present disclosure relates to the selective deposition of group IV semiconductor materials.

BACKGROUND OF THE DISCLOSURE

It is often desirable to selectively deposit a group IV semiconductor material such as silicon or germanium on semiconductor surfaces without depositing same on insulating surfaces.

For example, advanced complementary metal-oxide-semiconductor (CMOS) transistors are often fabricated using selective deposition techniques that grow epitaxially monocrystalline semiconductor films only on the active areas of the transistors, commonly known as elevated source/drain structures.

Generally speaking, selective deposition takes advantage of differential nucleation during deposition on disparate materials. The precursor of choice will generally have a tendency to nucleate and grow more rapidly on one surface and less rapidly on another surface.

At the beginning of a nucleation stage, discontinuous films on insulating materials (e.g. oxides) have a high exposed surface area relative to merged, continuous films on semiconductor materials (e.g. silicon).

Accordingly, state of the art selective deposition methods report using Cl-comprising precursors (such as dichlorosilane), or supplying HCl in the reactor during the deposition process or a combination of both to achieve selectivity. Chlorinated precursors (such as dichlorosilane) or etchants (such as HCl or $Cl_2$) are often used for further inhibition of the poorly nucleating film on the insulating material, as compared to the rapidly nucleating film on the semiconductor material. Germanium growth with $GeH_4$ is also selective when $H_2$ is used as a carrier gas, without the need of adding HCl.

A drawback of widely used silicon precursors like silane ($SiH_4$), disilane ($Si_2H_6$) and trisilane ($Si_3H_8$) is that they are not selective towards insulator materials such as oxide and nitride, such that the silicon growth takes place both on exposed semiconductor materials and insulator materials.

Typically, a selective deposition process is tuned to produce the highest deposition rate feasible on the region covered by a semiconductor material while accomplishing no or substantially no deposition on the regions covered by the insulating material.

Advanced device manufacturing often requires a reduced temperature budget for the selective deposition steps. Under this new constraint, the known methods for selective deposition based on a thermal activated process are no longer feasible, on account of the unacceptable low deposition rates at low temperature.

Using dichlorosilane ($Si_2H_2Cl_2$, DCS) or adding HCl should make the deposition selective. However, neither DCS nor HCl decompose at temperatures below 500° C. Therefore, at growth temperatures below 500° C. either no selectivity or simply no growth at all is observed. In particular, in the case of dichlorosilane, one monolayer of Si can be grown and then the reaction (growth) stops because Cl cannot be desorbed at the low reaction temperature.

In the case of germanium growth on a patterned semiconductor substrate comprising silicon areas and silicon-oxide areas, it is known that the growth is selective when germane ($GeH_4$) is used as precursor and hydrogen ($H_2$) as carrier gas in the deposition chamber. However, for temperatures below 350° C. germanium growth with $GeH_4$ and $H_2$ as carrier gas is not possible since germane does not decompose.

Digermane ($Ge_2H_6$) in $H_2$ or $N_2$ still decomposes at temperatures below 350° C. and can allow germanium growth, but the growth is not selective towards oxide, at least not for partial pressures of digermane higher than about 10 mTorr or higher than about 20 mTorr depending on the growth temperature for a total pressure in the reactor up to atmospheric pressure. This drawback is illustrated by the comparative test in FIG. 2A.

When Ge is grown on InGaAs and when using nitride spacers, a total loss of selectivity has been observed for Ge growth. In this case, indium outdiffusion from the surface to the nitride spacers might create a seed layer for Ge and then disable selectivity. This is illustrated by the comparative test in FIG. 3A.

Despite selective deposition of semiconductors being of considerable commercial importance for a variety of industrial applications, problems with respect to selectivity thus arise with known processes. Thus, there is a need for improved methods to selectively deposit semiconductor films onto semiconductor surfaces.

SUMMARY OF THE DISCLOSURE

It is an object of embodiments of the present disclosure to provide a method for selective deposition of semiconductor materials which overcomes problems encountered with prior art methods, in particular at low processing temperatures, e.g. below 650° C., or even below 500° C.

The above objective is accomplished by a method according to embodiments of the present disclosure.

In embodiments of the present disclosure, a method for providing selective deposition of a second semiconductor material on a first semiconductor material is disclosed. The method may include providing a patterned substrate comprising at least a first region and a second region, where the first region comprises an exposed first semiconductor material and the second region comprises an exposed insulator material. The method may further include loading the patterned substrate in a chemical vapour deposition (CVD) chamber and selectively providing a film comprising the second semiconductor material on the exposed first semiconductor material of the first region by providing a precursor of the second semiconductor material, a carrier gas that is non-reactive with Cl compounds, and tin-tetrachloride ($SnCl_4$) as Cl precursor into the chamber. The tin-tetrachloride inhibits the deposition of the second semiconductor material on the second region.

In some embodiments, selectively providing the film comprises depositing the film at a temperature lower than 650° C., or even lower than 500° C., in particular embodiments even below 350° C.

In some embodiments, providing a precursor of the second semiconductor material may comprise providing a precursor of a group IV element or an alloy of group IV elements. The film of second semiconductor material then deposited is a film of a group IV element or an alloy of group IV elements.

In some embodiments, the insulator material is selected from a group consisting of an oxide of a group IV element, a nitride of a group IV element, and any combination thereof.

In some embodiments, the first semiconductor material comprises silicon, germanium, or silicon germanium (SiGe).

In some embodiments, the second semiconductor material comprises silicon. In such embodiments, the precursor is a silicon-containing precursor, such as for example silane ($SiH_4$). In other embodiments, the second semiconductor material comprises germanium. In these embodiments, selectively providing the film may be performed at a temperature lower than 350° C. In such embodiments, the precursor is a germanium-containing precursor. In particular embodiments, the precursor may be digermane, for example at a partial pressure higher than 10 mTorr.

In some embodiments, the first semiconductor material comprises a binary or a tertiary III-V compound. The III-V compound may be selected from the group consisting of III-antimonides, III-arsenides, III-phosphides, and any combination thereof.

A method according to embodiments of the present disclosure wherein selective provision of the second semiconductor material on the semiconductor material of the first region includes providing a carrier gas, may comprise selecting the carrier gas as a first carrier gas that does not react with Cl-compounds. The first carrier gas may for example be $N_2$ or an inert gas (e.g. a noble gas).

In some embodiments, the method further comprises, subsequent to the selective provision of the film of the second semiconductor material on the first semiconductor material of the first region, non-selectively depositing a film of the second semiconductor material on the first region and on the second region by replacing the first carrier gas with a second carrier gas, such as for example $H_2$, that does react with Cl-compounds. During the selective provision, the non-selective deposition and in between both, the patterned substrate may be kept in the reaction chamber. Also during the non-selective deposition the precursor of the second semiconductor material and tin-tetrachloride ($SnCl_4$) may further be supplied into the chamber.

In some embodiments, dopant precursors may be supplied in the deposition chamber while selectively depositing the film of the second semiconductor material.

Particular aspects of the disclosure are set out in the accompanying independent and dependent claims. Features from the dependent claims may be combined with features of the independent claims and with features of other dependent claims as appropriate and not merely as explicitly set out in the claims.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

BRIEF DESCRIPTION OF THE DRAWINGS

The disclosure will now be described further, by way of example, with reference to the accompanying drawings, in which:

FIG. 1 illustrates a patterned substrate comprising a first region comprising an exposed semiconductor material, and a second region comprising an exposed insulator material, as an example substrate that may be used in embodiments of the present disclosure for selective depositing of a semiconductor material onto the exposed semiconductor material.

FIGS. 2A-2B show germanium deposition on a patterned substrate comprising silicon areas (first region) and silicon oxide areas (second region), including non-selective germanium deposition with 250 standard cubic centimeters per minute (sccm) $Ge_2H_6$ at 320° C. and atmospheric pressure (760 Torr) in the reactor (FIG. 2A—prior art), and selective germanium deposition on silicon (no deposition on silicon oxide) in accordance with embodiments of the present disclosure with 250 sccm $Ge_2H_6$ and 20 sccm $SnCl_4$, $N_2$ as carrier gas, at 320° C. and atmospheric pressure (760 Torr) in the reactor (FIG. 2B).

FIGS. 3A-3B show germanium deposition on a patterned substrate comprising InGaAs (first region) and silicon nitride (spacers) areas (second region), including non-selective germanium deposition with 200 sccm $Ge_2H_6$ at 300° C. and 10 Torr in the reactor (FIG. 3A—prior art), and selective germanium deposition (no deposition on silicon nitride) in accordance with embodiments of the present disclosure, with 200 sccm $Ge_2H_6$ and 10 sccm $SnCl_4$ at 300° C. and 10 Torr in the reactor (FIG. 3B).

The drawings are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

In the different drawings, the same reference signs refer to the same or analogous elements. Any reference signs in the claims shall not be construed as limiting the scope.

DETAILED DESCRIPTION

The present disclosure will be described with respect to particular embodiments and with reference to certain drawings but the disclosure is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the context of the present disclosure, a precursor is a compound that participates in a chemical reaction that produces another compound, whereby at least part of the precursor after reaction forms part of the another compound. In particular in the context of the present disclosure, the chemical reaction is a deposition reaction for depositing a semiconductor material film or layer.

In the context of the present disclosure, a single source precursor is a precursor where all the elements required into the another compound are provided in that single precursor.

In the context of the present disclosure, a carrier gas is a gas stream that brings a precursor of semiconductor material and tin-tetrachloride into the chemical vapour deposition chamber. The carrier gas can be any inert gas, i.e. a gas that is non-reactive with other components in the chemical vapour deposition chamber. The inert gas may be elemental, such as for example in case of noble gasses, or may be a compound gas. In embodiments of the present disclosure, the inert gasses are specifically selected for the particular operational settings of the chemical vapour deposition chamber for which they are functionally inert.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

FIG. 2A shows poly-Ge 20 deposition on silicon oxide and monocrystalline Ge 21 on Si with 250 sccm $Ge_2H_6$ with $N_2$ as carrier gas at 320° C. and atmospheric pressure (760 Torr) in the reactor.

Further tests show that when germanium is grown on a substrate comprising exposed InGaAs areas 11 and patterned structures covered with silicon nitride 12, a total loss in selectivity is observed for both precursors germane and digermane at a temperature of about 300° C. Deposition of poly-germanium 30 occurs overall on the substrate as shown in FIG. 3A with 200 sccm $Ge_2H_6$, $N_2$ as carrier gas, at 300° C. and 10 Torr in the reactor.

In each of the above disclosed examples, in accordance with embodiments of the present disclosure, selectivity of the deposition was achieved after the addition of tin-tetrachloride $SnCl_4$ in the process chamber during the deposition process.

Different embodiments of the present disclosure describe a method for selectively providing a film of a second semiconductor material onto a first semiconductor material, and not onto an insulator material, comprising:

a. Providing a patterned substrate 10 comprising at least a first region 11 and a second region 12 wherein the first region 11 comprises an exposed first semiconductor material and the second region 12 an exposed insulator material, b. Loading the patterned substrate in a CVD chamber;

c. Selectively providing a film of the second semiconductor material on the first semiconductor material of the first region 11 by providing a precursor of the second semiconductor material, a carrier gas and tin-tetrachloride ($SnCl_4$) into the chamber, whereby tin-tetrachloride inhibits the deposition of the second semiconductor material on the insulator material of the second region 12.

It is particularly advantageous that in a method according to embodiments the present disclosure, the step of selectively providing the film may be performed at a temperature lower than 650° C., or even lower than 500° C. Hence a method according to embodiments of the present disclosure may be used for low temperature selective deposition of semiconductor material.

Deposition of the second semiconductor material may be suitably conducted according to any of the various CVD methods known to those skilled in the art, i.e. atmospheric pressure CVD (APCVD) or low pressure CVD (LPCVD). Typical CVD deposition temperatures range from about 200° C. to about 800° C., however present disclosure is concerned with temperatures below 650° C. An example deposition process is conducted according to the CVD methods taught herein.

The substrate 10 comprises a semiconductor material such as silicon, germanium, III/V compound substrates, or another material compatible with the semiconductor manufacturing such as glass, quartz. The substrate 10 can further comprise silicon-on-insulator (SOI) or germanium-on-insulator (GeOI). In one embodiment, the substrate 10 could be a silicon wafer.

The substrate 10 comprises at least a first region 11 comprising an exposed first semiconductor material, and a second region 12 comprising an exposed insulator material. In particular embodiments, the first semiconductor material exposed at the patterned substrate 10 may comprise silicon, germanium or a combination thereof. Alternatively, the first semiconductor material may comprise a binary or a tertiary III-V compound. The III-V compound may be selected from the group consisting of III-antimonides, III-arsenides, III-phosphides and any combination thereof.

The second semiconductor material to be selectively provided on top of the first semiconductor material may comprise one or more group IV elements. In different embodiments of the present disclosure the second semiconductor material may be selected from the group consisting of Si, Ge, SiGe, C and/or Sn alloyed Si, Ge or SiGe and any combination thereof. The second semiconductor material may either be mono-crystalline or poly-crystalline, depending on the deposition conditions.

A precursor of the second semiconductor material is a gas comprising the semiconductor source material (group IV element). Further the precursor of the second semiconductor material can be a single-source precursor (e.g. $Si_xH_{2x+2}$, $Ge_xH_{2x+2}$, $SiCl_xH_{4-x}$, $SiH_3$—$CH_3$, $CH_4$ or combined $Si_xGe_yH_{2(x+y)+2}$ precursors) or a mixture of two or more precursors (e.g. $Si_xH_{2x+2}$ and $Ge_xH_{2x+2}$).

The precursor(s) of the second semiconductor material is (are) provided in the chamber in the presence of a carrier gas such as $N_2$, $H_2$ or a noble gas (He, Ar). In example embodiments, the carrier gas is $N_2$ or $H_2$.

In particular embodiments, the second semiconductor material may further comprise n-type (e.g. P, As) or p-type (e.g. B) dopants which may be provided by adding dopant precursor(s) during the growth process in the deposition chamber.

The insulator material exposed on the second region 12 of the patterned substrate 10 may be selected from a group consisting of an oxide- or a nitride- of a group IV element and any combination thereof. The insulator material may further comprise a second group IV element such as carbon (C). In specific embodiments of the present disclosure the insulator material is selected from the group consisting of silicon oxide, silicon nitride and a combination thereof.

Tin-tetrachloride has the advantage of being an economically interesting and widely used compound, albeit not in the semiconductor manufacturing.

In different embodiments of the present disclosure $SnCl_4$ is provided to the deposition chamber diluted in a carrier gas such as $N_2$ or $H_2$ or an inert gas.

The flow of $SnCl_4$ provided in the deposition chamber is limited at the lower end by the minimum amount of Cl necessary to achieve selective deposition and at the upper end by the lowest between the $SnCl_4$ flow corresponding to the maximum amount of Sn that can be allowed in the grown material and the $SnCl_4$ flow at which the growth turns into etching. The upper and lower limits of the $SnCl_4$ flow (or their equivalent partial pressure) depend therefore on the configuration of the deposition chamber and the intended application of the grown material.

In particular embodiments of the present disclosure similar amounts (about 1:1 ratio in molar flows) were used for the group IV—precursor and $SnCl_4$.

In one example silicon is grown selectively on a patterned substrate comprising silicon areas 11 and silicon oxide areas 12, only on the silicon areas 11. The silicon precursor is selected from the group consisting of silane, disilane, trisilane and higher order silanes such as neo-pentasilane.

Advantageously, in this specific embodiment silane can be used at temperatures below 500° C. in combination with $SnCl_4$ to provide selective deposition of silicon. Both precursors are widely available and do not impose safety constraints at this manufacturing step. This represents a clear advantage of the method in contrast with the known solutions using e.g. trisilane and $Cl_2$ known to present serious safety risks.

$SnCl_4$ is a stable precursor, suitable for low temperature deposition processes. Additionally, during selective deposition there is very low incorporation of Sn in the deposited material, typical concentration levels of about $10^{18}$-$10^{19}$ at·cm$^{-3}$, generally lower than $10^{20}$ at·cm$^{-3}$. Being a group IV element, Sn does not influence the electrical properties of the grown film, although a band-gap narrowing effect comparable to that appearing in SiGe compounds is possible.

Therefore, the method of embodiments of the present disclosure is suitable for epitaxially growing silicon, germanium or SiGe for different applications, e.g. elevated source/drain applications or forming Si passivation layers on SiGe comprising areas.

In another example the patterned substrate comprises on the first region 11 exposed silicon and on the second region 12 exposed silicon oxide. The selective deposition of a germanium film on silicon in accordance with embodiments of the present disclosure is performed at 320° C. using 250 sccm $Ge_2H_6$ as a germanium precursor and 20 sccm $SnCl_4$, with $N_2$ as carrier gas at 320° C. and atmospheric pressure (760 Torr) in the reactor. The deposition is selective towards the silicon oxide as shown in FIG. 2B.

Without wishing to be bound by theory, it is believed that Sn acts as a more active site for Cl desorption due to the lower bonding energy Sn—Cl as compared to Si—Cl, hence accelerating the Cl desorption process and therefore the $SnCl_4$ decomposition process.

In yet another example, the patterned substrate 10 comprises on the first region 11 comprising exposed binary or a tertiary III-V compound and a second region 12 comprising exposed silicon nitride.

In the example, the III-V compound is InGaAs and thereupon a film of germanium is selectively deposited with 200 sccm $Ge_2H_6$ and 10 sccm $SnCl_4$ at 300° C. and 10 Torr in the reactor. The deposition is selective towards the silicon nitride material of the spacers as shown in FIG. 3B.

In embodiments of the present disclosure, the precursor(s) of the second semiconductor material is (are) provided in the chamber in the presence of a carrier gas. The carrier gas could be a gas which does not react with Cl-compounds to form by-products. In this way, 4 Cl atoms are provided with 1 Sn atom during the reaction and the second semiconductor material is grown selectively, i.e. there is no deposition on the regions 12 comprising an exposed insulator.

In particular embodiments of the present disclosure, the carrier gas is selected such that it does not react with Cl compounds.

In particular embodiments, the method of embodiments of the present disclosure further comprises:

d. subsequent to the selective deposition, non-selectively depositing a film of the second semiconductor material on the first region and on the second region by replacing the carrier gas with a second carrier gas which is reacting with Cl-compounds, while keeping the patterned substrate in the reaction chamber and supplying further the precursor of a second semiconductor material and tin-tetrachloride ($SnCl_4$) into the chamber.

Examples of a carrier gas which does not react with Cl-compounds are $N_2$, or an inert gas (e.g. a noble gas such as He, Ar) or any combinations or mixtures thereof.

Examples of a second carrier gas which reacts with Cl-compounds are $H_2$ or $H_2$-comprising mixtures.

In the embodiments of the present disclosure wherein the carrier gas is $N_2$ or a noble gas, the growth is selective since the precursors of the second semiconductor material are reacting with $SnCl_4$ to form a second semiconductor material (e.g. Ge-comprising semiconductor in case of $Ge_2H_6$).

If the carrier gas reacts with Cl-compounds (from $SnCl_4$) so as to form by-products then the selectivity of the growth process is negatively affected. In the particular example of $H_2$ as carrier gas, HCl by-products are formed that reduce the $Cl_2$ amount available for selective growth, thereby impeding the selective growth of the second semiconductor material.

Advantageously, the growth-type of the second semiconductor material can be switched/changed from selective growth to non-selective growth by replacing the carrier gas in the reaction chamber. In particular embodiments replacing $N_2$ or the noble gas with $H_2$ leads to changing the selective growth into a non-selective growth. Complex structures can be grown by sequentially changing the growth type from selective to non-selective without taking the substrate out of the reaction chamber and/or changing the precursors.

In embodiments of the present disclosure wherein the second semiconductor material is doped, dopant precursors (such as, e.g. $B_2H_6$, $PH_3$, $PCl_3$) are supplied into the reaction chamber. These dopants precursors may also react with the Cl-compounds (e.g., forming $B_2Cl_6$ in case of $B_2H_6$ precursor) thereby diminishing the selectivity. To compensate for the diminished selectivity the amount of Cl-compounds present in the reaction chamber may be increased by e.g. increasing the $SnCl_4$ concentration and/or by supplying an additional Cl-comprising gas (e.g. $Cl_2$, HCl).

In particular embodiments of the present disclosure different flows of Ge-precursor ($Ge_2H_6$) between 500 sccm and 1000 sccm were tested. The flows of $SnCl_4$ in the reaction chamber were varied between 20 sccm and 120 sccm. The tests were performed on substrates comprising silicon oxide at 320° C. and atmospheric pressure in the reactor.

Some non-limitative examples will be discussed herein further.

In the examples wherein 20 standard liter per minute (slm) of $N_2$ was used as carrier gas, selective growth was achieved for 500 sccm $Ge_2H_6$ and a SnCl4 flow of, respectively, 40 sccm, 80 sccm and 120 sccm. The growth was selective since for a deposition time of 1.5 min, 3 min and 4.5 min no deposition was observed on silicon oxide, while 40 nm, 80 nm and, respectively, 120 nm germanium-comprising material was deposited on the first semiconductor material (in this example Ge).

In the examples wherein 20 slm $H_2$ was used as carrier gas, non-selective growth was achieved for 500 sccm $Ge_2H_6$ and a $SnCl_4$ flow of respectively, 20 sccm and 40 sccm. The growth was non-selective since for a deposition time of 1.5 min 40 nm of germanium-comprising material was deposited on silicon oxide and 35 nm on the first semiconductor material (in this example Ge).

In the examples wherein 20 slm $N_2$ was used as carrier gas and an additional dopant precursor ($B_2H_6$=1 sccm) was supplied in the reaction chamber, a selective growth was achieved for 500 sccm $Ge_2H_6$ and a $SnCl_4$ flow of 120 sccm. For 500 sccm $Ge_2H_6$ and a $SnCl_4$ flow of 20 sccm and 40 sccm a non-selective growth was obtained. For 500 sccm $Ge_2H_6$ and a $SnCl_4$ flow of 80 sccm the selectivity obtained was poor.

The selective growth obtained with 500 sccm $Ge_2H_6$ and a $SnCl_4$ flow of 40 sccm turns into a non-selective growth when 1 sccm $B_2H_6$ is added as dopant during growth. The effect of the dopant precursor can be compensated by the addition of about 100 sccm HCl which turns the growth back into a selective process (restores the selectivity of the growth against silicon oxide). Alternatively another Cl-comprising compound ($Cl_2$) or a higher flow of $SnCl_4$ can be used.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

What is claimed is:

1. A method comprising:
    providing, in a reaction chamber, a patterned substrate comprising at least a first region and a second region, wherein the first region comprises an exposed first semiconductor material and the second region comprises an exposed insulator material;
    depositing a first film comprising a second semiconductor material on the patterned substrate, wherein depositing the first film comprises selectively providing the second semiconductor material on the exposed first semiconductor material of the first region by providing a gas mixture, wherein the gas mixture comprises:
        i) a precursor of the second semiconductor material;
        ii) a carrier gas, wherein the carrier gas is configured to be non-reactive with chlorine compounds; and
        iii) tin-tetrachloride.

2. The method of claim 1, wherein the reaction chamber comprises a chemical vapour deposition chamber.

3. The method of claim 1, wherein depositing the first film comprising the second semiconductor material comprises depositing the first film at a temperature lower than 650° C.

4. The method of claim 1, wherein the carrier gas comprises nitrogen gas.

5. The method of claim 1, wherein the carrier gas comprises an inert gas.

6. The method of claim 1, wherein the precursor of the second semiconductor material comprises a group IV element.

7. The method of claim 1, wherein the precursor of the second semiconductor material comprises an alloy of group IV elements.

8. The method of claim 1, wherein the precursor of the second semiconductor material comprises a precursor selected from the group consisting of:
    i) a silicon precursor;
    ii) a germanium precursor; and
    iii) silane.

9. The method of claim 1, wherein the precursor of the second semiconductor material comprises digermane at a partial pressure higher than 10 mTorr.

10. The method of claim 1, wherein depositing the first film comprising the second semiconductor material comprises depositing the first film at a temperature below 350° C.

11. The method of claim 1, wherein the second region comprises an insulator material selected from the group consisting of:
    i) an oxide of a group IV element;
    ii) a nitride of a group IV element; and
    iii) any combination thereof.

12. The method of claim 1, wherein the first region comprises silicon.

13. The method of claim 1, wherein the first region comprises germanium.

14. The method of claim 1, wherein the first region comprises silicon germanium.

15. The method of claim 1, wherein the first region comprises a semiconductor material selected from the group consisting of:
   i) a binary III-V compound; and
   ii) a tertiary III-V compound.

16. The method of claim 13, wherein the first region comprises a III-V compound selected from the group consisting of:
   i) III-antimonides;
   ii) III-arsenides;
   iii) III-phosphides; and
   iv) any combination thereof.

17. The method of claim 1, further comprising, subsequent to depositing the first film, while keeping the patterned substrate in the reaction chamber, non-selectively depositing a second film of the second semiconductor material on the first region and on the second region by replacing, in the gas mixture, the carrier gas with a second carrier gas, wherein the second carrier gas is configured to react with chlorine compounds.

18. The method of claim 17, wherein the second carrier gas comprises hydrogen.

19. The method of claim 17, wherein the carrier gas comprises nitrogen.

20. The method of claim 17, wherein the carrier gas comprises an inert gas.

* * * * *